United States Patent [19]
Ichikawa

[11] Patent Number: 5,808,954
[45] Date of Patent: Sep. 15, 1998

[54] SEMICONDUCTOR MEMORY DEVICE HAVING STABILIZING CIRCUIT OF WORD LINE ACTIVATING VOLTAGE

[75] Inventor: Tsutomu Ichikawa, Kanagawa, Japan

[73] Assignee: Sony Corporation, Japan

[21] Appl. No.: 816,939

[22] Filed: Mar. 14, 1997

[30] Foreign Application Priority Data

Mar. 21, 1996 [JP] Japan .................................. 8-064951

[51] Int. Cl.[6] .................................................. G11C 7/00
[52] U.S. Cl. ...................... 365/226; 365/189.09; 327/535
[58] Field of Search .......................... 365/189.06, 189.09, 365/189.11, 230.06, 226; 327/535, 536, 538

[56] References Cited

U.S. PATENT DOCUMENTS 5,184,035  2/1993  Sugibayashi ................... 365/189.09 X
5,388,084  2/1995  Itoh et al. ............................... 365/226

*Primary Examiner*—David C. Nelms
*Assistant Examiner*—Hoai V. Ho
*Attorney, Agent, or Firm*—Ronald P. Kananen

[57] ABSTRACT

A semiconductor memory device having an internal constant voltage source in which a charge pumping circuit generates a boosted voltage, wherein by using a constant voltage drop circuit or a voltage follower which outputs a voltage following a reference voltage, a voltage adjusted to a minimum operating voltage of the memory cells or a voltage near to the minimum operating voltage is supplied to the word lines during activation.

12 Claims, 3 Drawing Sheets

SEMICONDUCTOR MEMORY DEVICE HAVING STABILIZING CIRCUIT OF WORD LINE ACTIVATING VOLTAGE

BACKGROUND OF THE INVENTION

1. Field of the Invention

The present invention relates to a semiconductor memory device, for example, a static random access memory (SRAM).

2. Description of the Related Art

To reduce the power consumption or ensure the reliability of the gate oxide film in a semiconductor memory device, for example, a SRAM, it is required to lower the power supply voltage.

In the related art, one method used to deal with this was to use six-transistor full CMOS memory cells. Another method was, in the case of a thin film transistor (TFT) load type memory cell, to switch the word line voltage between two stages or, in the case of a high resistance load type memory cell or a TFT load type memory cell, when simply boosting the power supply voltage, boosting the word line voltage until the high level for the write operation becomes equal to the power supply voltage even if the power supply voltage is a high voltage not obstructing the operation of the memory cell.

The methods mentioned above have several drawbacks. For example, a full CMOS memory cell is larger in dimension compared with a high resistance load or a TFT load memory cell. In the case of the 2-step boosting of voltages of the word lines in a TFT load memory cell, the control of the level of the boosted voltage or the operation timing is complicated. Furthermore, in a TFT load or a high resistance load memory cell, when boosting the voltages of the word lines, it is possible that an overboosted voltage will be supplied to the gate oxide film of the transistors and thereby reduce the reliability of the transistors.

SUMMARY OF THE INVENTION

An object of the present invention is to provide a semiconductor memory device having a circuit for stabilizing the word line voltage by which a high degree of integration and reduction of voltage can be realized and, further, the control can be simplified and a higher operational speed and a lower consumption of power can be attained.

To achieve the above object, the present invention provides a semiconductor memory device comprising bit lines arranged in column directions; word lines arranged in row directions; memory cells arranged at the cross-points of the bit lines and word lines; a boost circuit for boosting a power supply voltage; and a voltage stabilizing circuit for stabilizing the output voltage of the boost circuit; the output voltage of the boost circuit stabilized by the voltage stabilizing circuit being supplied to the word lines as an activating voltage of the word lines.

Preferably, the voltage stabilizing circuit comprises a constant voltage dropping means connected between an output node of the boost circuit and a reference voltage source.

Preferably, the constant voltage dropping means contains at least one metal-insulator-semiconductor transistor with a connected gate and drain.

Preferably, the boost circuit is constituted by a charge pumping circuit, a repeat frequency of a charge pump of the charge pumping circuit being switched between activation and standby times and the frequency during the standby time being set lower than the frequency during activation.

Preferably, the output voltage of the voltage stabilizing circuit is adjusted to a minimum operating voltage of the memory cells or a voltage near to the minimum operating voltage.

Preferably, the voltage stabilizing circuit has a means for generating a reference voltage and an operational amplifier; the output voltage of the boost circuit is supplied to an operational amplifier as a power supply voltage of the operational amplifier; one input terminal of the operational amplifier is connected to the means for generating the reference voltage; an output node of the operational amplifier is connected to the other input terminal of the operational amplifier to form a negative feedback circuit; and the output voltage of the voltage stabilizing circuit is adjusted to a minimum operating voltage of the memory cells or a voltage near to the minimum operating voltage.

Preferably, the output terminal of the boost circuit is connected to a constant voltage dropping means.

According to the present invention, for example, the boosted voltage stabilized by the voltage stabilizing circuit is supplied to the word lines of the semiconductor memory device operating at low power supply voltage during memory access. The voltage stabilizing circuit is constituted by two transistors connected in series which is equal in the structure to an inverter constituted by an access transistor and a driver transistor forming a memory cell, and the gates of these transistors are connected to the drains of the transistors, namely, the transistors are connected as diodes.

As a result, the boosted voltage is limited to a voltage of the sum of the threshold voltages of these transistors, and the boosted voltage is stabilized.

Furthermore, the output voltage of the voltage stabilizing circuit may be adjusted during the wafer process or after packaging. A current generated by the current source is input to the two transistors connected in series and a reference voltage is generated. The reference voltage is controlled by adjusting the current generated by the current source using a variable resistor. According to this, since the output voltage of the voltage stabilizing circuit is also variable, the output voltage of the voltage stabilizing circuit can be set according to the application of the semiconductor memory device.

BRIEF DESCRIPTION OF THE DRAWINGS

The above and other objects and features of the present invention will be described in more detail below with reference to the accompanying drawings, in which.

DESCRIPTION OF THE PREFERRED EMBODIMENTS

Figure 1:
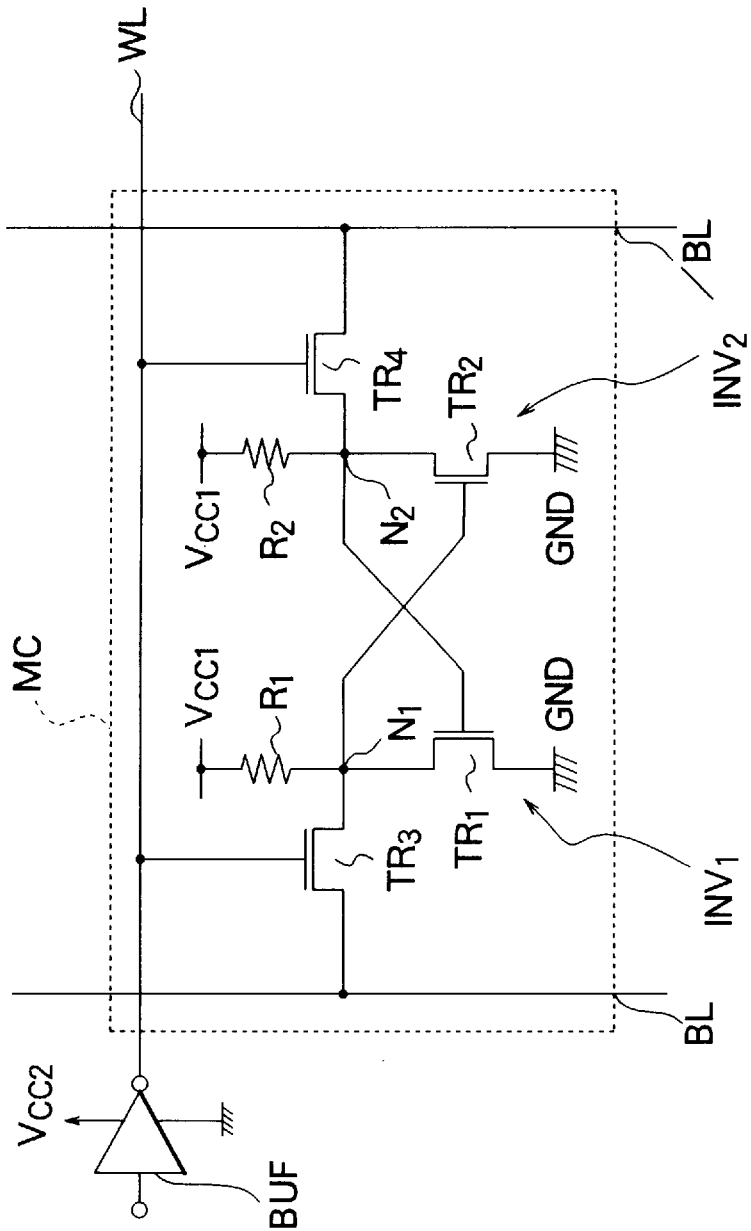
FIG. 1 is circuit diagram of an example of a SRAM memory cell.

FIG. 1 is a circuit diagram of a high resistance load SRAM memory cell MC. In FIG. 1, $R_1$ and $R_2$ denote resistors, $TR_1$ and $TR_2$ denote driver transistors constituted by NMOS transistors, $TR_3$ and $TR_4$ denote access transistors constituted by NMOS transistors, $N_1$ and $N_2$ denote storage nodes, WL denotes a word line, BL and /BL denote bit lines, and BUF denotes a word line buffer, respectively. $V_{CC1}$ denotes the power supply voltage of the memory cell MC, while $V_{CC2}$ denotes the power supply voltage of the buffer BUF.

As shown in FIG. 1, the resistor $R_1$ and the driver transistor $TR_1$ are connected serially between the supply line of the power supply voltage $V_{CC1}$ and ground, the node $N_1$ is constituted by the connection point thereof, the resistor $R_2$ and the driver transistor $TR_2$ are connected serially between the supply line of the power supply voltage $V_{CC1}$ and ground, and the node $N_2$ is constituted by the connection point thereof. The gate of the driver transistor $TR_1$ is connected to the node $N_2$, and the gate of the driver transistor $TR_2$ is connected to the node $N_1$. The node $N_1$ is connected to the bit line BL through the access transistor $TR_3$, and the node $N_2$ is connected to the bit line BL through the access transistor $TR_4$.

The gates of the access transistors $TR_3$ and $TR_4$ are connected to the word line WL, while the word line WL is connected to the output terminal of the word line buffer BUF. The buffer BUF is supplied with the power supply voltage $V_{CC2}$, so the word line WL is set at the voltage of the power supply voltage $V_{CC2}$ at the time of activation.

An inverter $INV_1$ is constituted by the resistor $R_1$ and the driver transistor $TR_1$, while an inverter $INV_2$ is constituted by the resistor $R_2$ and the driver transistor $TR_2$. The two inverters are cross-coupled. The output terminal of the inverter $INV_1$, that is, the node $N_1$, is connected to the input terminal of the invertor $INV_2$, and the output terminal of the invertor $INV_2$, that is, the node $N_2$, is connected to the input terminal of the $INV_1$.

The word line WL is driven by the word line buffer BUF. In general memory devices, the operating power supply voltage $V_{CC2}$ of the buffer BUF is equal to the power supply voltage $V_{CC1}$ of the memory cell MC. But here, the operating power supply voltage $V_{CC2}$ that is supplied to the buffer BUF is higher than the power supply voltage $V_{CC1}$ that is supplied to the memory cell MC. During reading and writing operations, the word line WL is set at a high level of the power supply voltage $V_{CC2}$ by the word line buffer BUF. Therefore, the word line WL is set at a voltage level higher than the power supply voltage $V_{CC1}$ of the memory cell MC at activation.

First Embodiment

Figure 2:
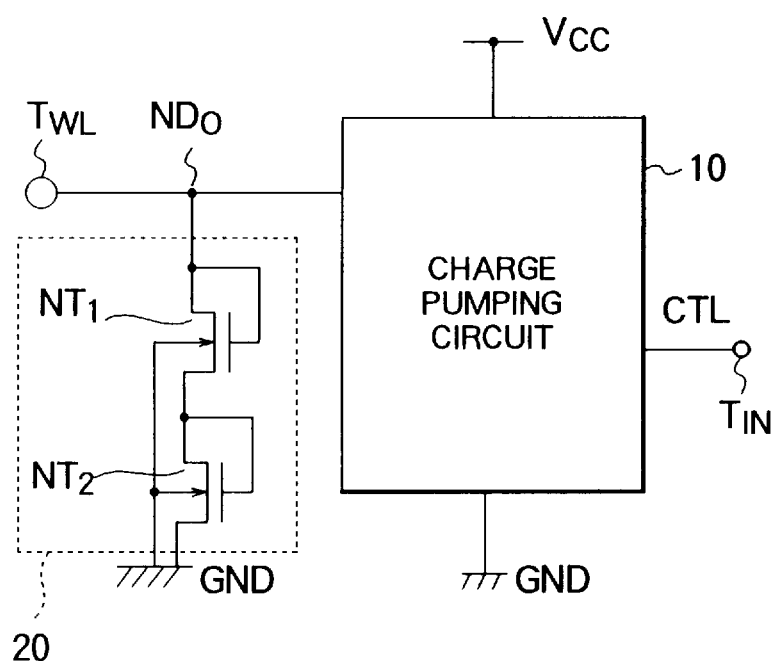
FIG. 2 is a circuit diagram of a first embodiment of the present invention.

FIG. 2 is a circuit diagram of a first embodiment of the semiconductor memory device of the present invention. In FIG. 2, 10 denotes a charge pumping circuit, 20 denotes a voltage stabilizing circuit, $V_{CC}$ denotes a power supply voltage, GND denotes the ground as a reference voltage, $T_{WL}$ denotes an output terminal of the voltage stabilizing circuit, $NT_1$ and $NT_2$ denote NMOS transistors that constitute the voltage stabilizing circuit, $ND_0$ denotes an output node of the boosted voltage, and $T_{IN}$ denotes the input terminal of the frequency switching control signal CTL of the boost operation, respectively.

The boosted voltage generated by the charge pumping circuit 10 is stabilized by the voltage stabilizing circuit 20 constituted by the NMOS transistors $NT_1$ and $NT_2$, then output to the output terminal $T_{WL}$ as a word line voltage.

Here, the voltage of $V_{CC}$ is, for example, 1V. The power supply voltage of 1V is boosted to, for example, 2V by the charge pumping circuit 10 and output to the node $ND_0$.

The voltage stabilizing circuit 20 is constituted by the NMOS transistors $NT_1$ and $NT_2$. The NMOS transistors $NT_1$ and $NT_2$ are connected in series between the node $ND_0$ and ground. The drain and the gate of the NMOS transistor $NT_1$ are connected together to the node $ND_0$, the source of the NMOS transistor $NT_1$ is connected to the drain and the gate of the NMOS transistor $NT_2$, and the source of the NMOS transistor $NT_2$ is grounded. The substrates of both the NMOS transistors $NT_1$ and $NT_2$ are grounded.

The voltage $V_{ND0}$ of the node $ND_0$ is limited to the sum of the threshold voltages $V_{t1}$ and $V_{t2}$ of the NMOS transistors $NT_1$ and $NT_2$. Therefore, ($V_{ND0}=V_{t1}+V_{t2}$). The threshold voltage $V_{t1}$ of the NMOS transistor $NT_1$ includes a substrate bias effect. Here, for example, the threshold voltages $V_{t1}$ and $V_{t2}$ are 0.8V and 0.6V, respectively, so the voltage $V_{ND0}$ of the node $ND_0$ is therefore stabilized at 1.4V.

In the memory cell MC shown in FIG. 1, in an ideal case in which the characteristics of the inverters $INV_1$ and $INV_2$ constituted by the driver transistors $TR_1$ and $TR_2$ and the resistors $R_1$ and $R_2$ are identical, the minimum operating power supply voltage $V_{CCmin}$ of the memory cell MC, that is, the minimum power supply voltage $V_{CC}$ of the memory cell MC, can be lowered to a voltage at which the threshold voltages $Vth_1$ and $Vth_2$ of the driver transistors $TR_1$ and $TR_2$ are equal ($Vth_1=Vth_2$).

In practice, memory cells are not ideal, and their characteristics are different from each other. In this case, the minimum operating power supply voltage $V_{CCmin}$ of the memory cell MC can be improved considerably by setting the word line voltage at about the same voltage level of the minimum operating power supply voltage $V_{CCmin-nor}$ of the normal operation.

Actually, the word line voltage supplied to the word line WL is equal to the sum of the threshold voltages of the access transistors considering the substrate bias effect and the threshold voltages of the driver transistors.

The voltage stabilizing circuit 20 is constituted by two diode-connected transistors connected in series which is identical in structure to the inverter constituted by the access transistor and the driver transistor in the memory cell MC. Therefore, the voltage of the voltage drop at the diode-connected transistors when the leakage current flows through them is stabilized and output to the word line voltage output terminal as the stabilized word line voltage $V_{WL}$ and supplied to the selected word line in activation.

In the charge pumping circuit 10, the frequency of the boosting operation is controlled by the control signal CTL input to the input terminal $T_{IN}$. The frequency of the boosting operation is set differently in activation and standby. For example, the frequency of boosting operation during standby is held lower than that in activation. According to this, the power consumption of the boost circuit and the voltage stabilizing circuit is lowered during standby.

As mentioned above, the frequency of the boost operation of the charge pumping circuit 10 is controlled according to the control signal CTL input to the input terminal $T_{IN}$, and the frequency of the boost operation during standby is set lower than that during activation.

The boost voltage generated by the charge pumping circuit 10 is output to the node $ND_0$, and is stabilized at the voltage of the sum of the threshold voltages $V_{t1}$ and $V_{t2}$ of the NMOS transistors $NT_1$ and $NT_2$ constituting the voltage stabilizing circuit 20 connected serially between the node $ND_0$ and ground.

As explained above, the boosted voltage generated by the charge pumping circuit 10 is stabilized by the voltage stabilizing circuit 20. That is, due to the diode-connected NMOS transistors $NT_1$ and $NT_2$ connected serially between the output node $ND_0$ of the charge pumping circuit 10 and ground, the boosted voltage output by the charge pumping circuit 10 is stabilized at the voltage of the sum of the threshold voltages $V_{t1}$ and $V_{t2}$ of these NMOS transistors. As a result, the word line voltage output to the terminal $T_{WL}$ and supplied to the word line in activation can be stabilized. Furthermore, because the frequency of the boost operation during standby is set lower than that during activation according to the frequency switching control signal CTL input to the input terminal $T_{IN}$, the power consumption during standby can be lowered.

Second Embodiment

Figure 3:
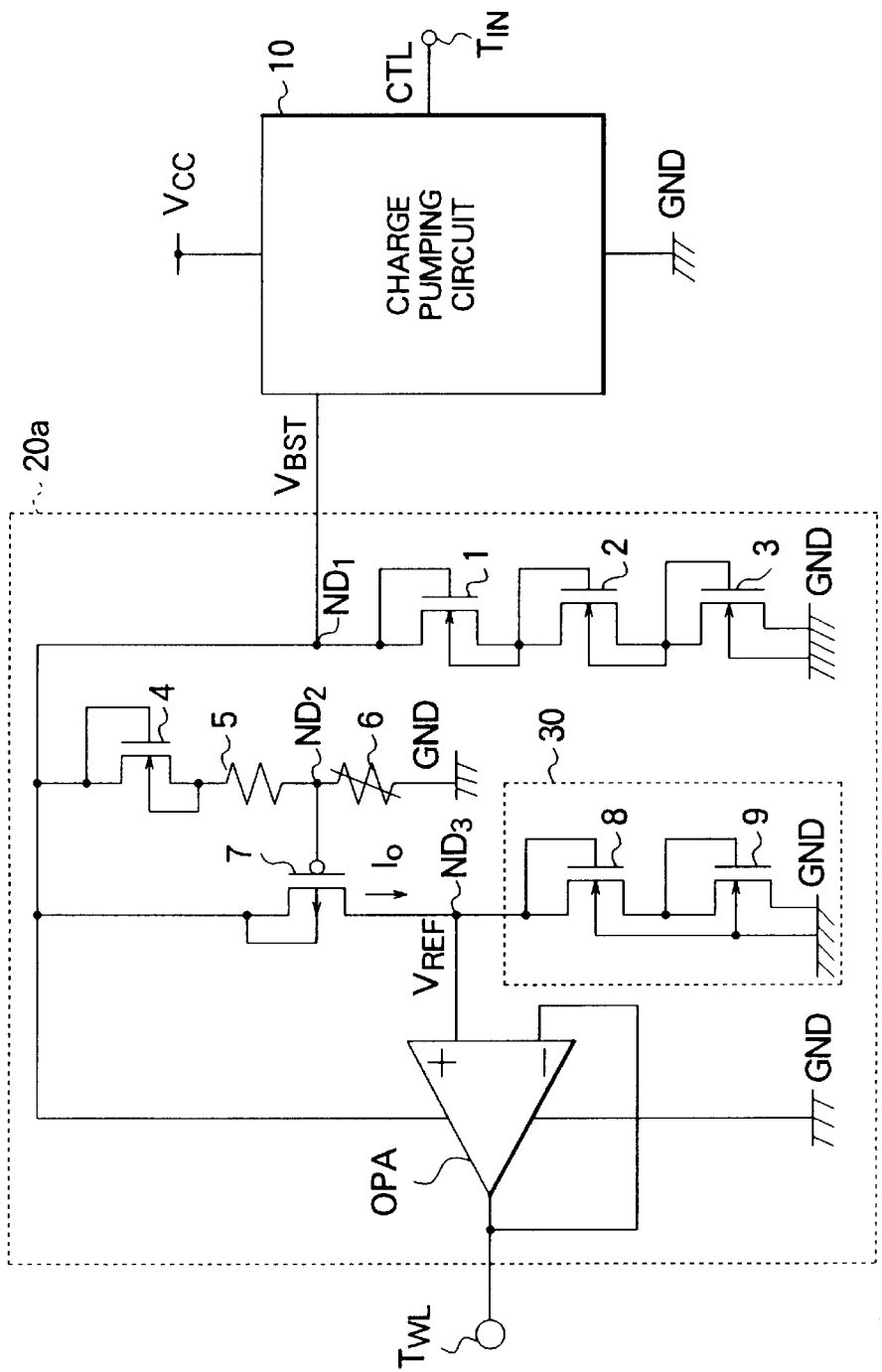
FIG. 3 is a circuit diagram of a second embodiment of the present invention.

FIG. 3 is a circuit diagram of a second embodiment of the semiconductor memory device of the present invention.

In FIG. 3, 10 denotes a charge pumping circuit, 20 denotes a voltage regulating circuit, 30 denotes a reference voltage circuit, 1, 2, 3, 4, 8, and 9 denote NMOS transistors, 5 denotes a resistor, 6 denotes a variable resistor, 7 denotes a PMOS transistor, OPA denotes an operational amplifier, $I_0$ denotes a current generated by a current source, $ND_1$, $ND_2$, and $ND_3$ denote nodes, and $T_{IN}$ denotes the input terminal of a frequency switching control signal CTL, respectively.

The node $ND_1$ is connected to the output terminal of the charge pumping circuit 10, while the NMOS transistors 1, 2, and 3 are connected in series between the node $ND_1$ and ground. The NMOS transistor 4, the resistor 5, and the variable resistor 6 are connected in series between the node $ND_1$ and ground. The connection point of the resistor 5 and the variable resistor 6 constitutes the node $ND_2$.

The reference voltage circuit 30 is constituted by the NMOS transistors 8 and 9 connected in series. The PMOS transistor 7 and the reference voltage circuit 30 are connected between the node $ND_1$ and ground, and the connection point thereof constitutes the node $ND_3$. Further, the gate of the PMOS transistor 7 is connected to the node $ND_2$.

The input terminal "−" of the operational amplifier OPA is connected to the output terminal of the operational amplifier OPA, while the input terminal "+" is connected to the node $ND_3$. Namely, a voltage follower is constituted by the operational amplifier OPA. The voltage output to its output terminal follows the voltage of the node $ND_3$ input to the input terminal "+". Further, the voltage of the node $ND_1$ is supplied to the operational amplifier OPA as its operating power supply voltage.

Here, the operation power supply voltage of the charge pumping circuit 10 is, for example, 1V and a boosted voltage $V_{BST}$ of, for example, 3V is output to the node $ND_1$ by the charge pumping circuit 10. The voltage of the node $ND_1$ is limited to a voltage of about the sum of the threshold voltages of the three NMOS transistors 1, 2, and 3 connected serially between the node $ND_1$ and ground. Here, the threshold voltages of these NMOS transistors are all, for example, 0.7V, and the voltage of the node $ND_1$ $V_{ND1}$ is therefore 2.1V.

The NHOS transistor 4, resistor 5, and the variable resistor 6 connected in series between the node $ND_1$ and ground and further the PMOS transistor 7 connected between the node $ND_1$ and the node $ND_3$ constitute a current source. The voltage of the node $ND_2$ can be set at any value within a certain range by adjusting the resistance of the variable resistor 6. The current $I_0$ flowing through the PMOS transistor 7 having its gate connected to the node $ND_2$ changes in accordance with the voltage of the node $ND_2$. That is, the current $I_0$ generated by the current source is fixed by the resistance of the variable resistor 6.

The current generated by the current source is input to the reference voltage circuit 30. As a result, the reference voltage $V_{REF}$ generated by the reference voltage circuit 30, namely, the voltage of the node $ND_3$, is set by the current $I_0$ generated by the current source. Since the reference voltage $V_{REF}$ is input to the input terminal "+" of the operational amplifier OPA which constitutes a voltage follower, the voltage output to the output terminal of the operational amplifier OPA is equal to the reference voltage $V_{REF}$. The output voltage of the operational amplifier OPA is output to the output terminal $T_{WL}$ and supplied to the word lines of the semiconductor memory device.

Below, the voltage regulating operation will be explained with reference to the configuration of the voltage regulating circuit 20a.

As shown in FIG. 3, the boosted voltage $V_{BST}$ generated by the charge pumping circuit 10 is input to the node $ND_1$ of the voltage regulating circuit 20a, and the voltage level is limited by the NMOS transistors 1, 2, and 3 connected in series to a voltage of, for example, 2.1V. The voltage of the node $ND_1$ is supplied to the current source constituted by the NMOS transistor 4, the resistor 5, and the variable resistor 6 connected in series. In the node $ND_2$, which is the connection point of the resistor 5 and the variable resistor 6, the voltage $V_{ND2}$ of the node $ND_2$ is generated in accordance with the voltage drops at the NMOS transistor 4, the resistor 5, and the variable resistor 6, respectively.

Since the node $ND_2$ is connected to the gate of the PMOS transistor 7, the value of the current $I_0$ flowing through the PMOS transistor 7 is set by the voltage $V_{ND2}$ of the node $ND_2$. The current $I_0$ is input to the reference voltage circuit 30 constituted by the NMOS transistors 8 and 9 connected in series, and the reference voltage $V_{REF}$ is generated by the reference voltage circuit 30. Then, the reference voltage $V_{REF}$ is output to the output terminal $T_{WL}$ through the voltage follower constituted by the operational amplifier OPA. Since the reference voltage $V_{REF}$ generated by the reference voltage circuit 30 is set at a nearby range including the minimum operating power supply voltage of the memory cell, the voltage output to the voltage output terminal $T_{WL}$ is also held at the nearby range including the minimum operating power supply voltage of the memory cells.

In the voltage regulating circuit 20a, the value of the current $I_0$ generated by the current source is fixed according to the voltage $V_{ND2}$ of the node $ND_2$, namely, the value of the current $I_0$ is changed in accordance with the change of the resistance of the variable resistor 6. As a result, the reference voltage $V_{REF}$ generated by the reference voltage circuit 30 is also changed. By adjusting the resistance of the variable resistor 6 at the wafer process or after packaging, the word line voltage $V_{WL}$ generated by the voltage regulating circuit 20a may be set on the basis of the operation condition of the memory device.

In the same way as the first embodiment described above, in this second embodiment, in the charge pumping circuit 10, the frequency of the boost operation during standby is set lower than that during activation in response to the frequency switching control signal CTL input to the input terminal $T_{IN}$. As a result, the power consumption of the charge pumping circuit 10 and the voltage regulating circuit 20a during standby fall. Further, the operation frequency during activation is set higher than that during standby, the charge pumping circuit 10 operates normally for boosting the voltage, and the boosted voltage $V_{BST}$ is applied to the voltage regulating circuit 20a. Using the voltage regulating circuit 20a, the boosted voltage generated by the charge pumping circuit 10 is adjusted in voltage level in accordance with the current $I_0$ of the current source fixed by the variable resistor 6 and is set at the nearby range including the minimum operating power supply voltage of the memory cells and then supplied to the word lines.

As described above, according to the present embodiment, since the boosted voltage $V_{BST}$ generated by the charge pumping circuit 10 Is limited by the NMOS transistors 1, 2, and 3 connected in series, the current $I_0$ generated by the current source is input to the reference voltage circuit 30 to generate the reference voltage $V_{REF}$, and the reference voltage $V_{REF}$ is regulated by adjusting the resistance of the variable resistor 6 constituting the current source and then output to the output terminal $T_{WL}$ through the voltage follower constituted by the operational amplifier OPA, the output voltage of the voltage regulating circuit 20a can be adjusted at the time of the wafer process or after packaging.

What is claimed is:

1. A semiconductor memory device comprising:
   bit lines arranged in a column direction:
      word lines arranged in a row direction;
      memory cells arranged at the cross points of the bit lines and word lines;
   a boost circuit for boosting a power supply voltage, the boost circuit including a charge pumping circuit, a repeat frequency of a charge pump of the charge pumping circuit switched between activation and standby times, the frequency during said standby being lower than the frequency during activation; and
   a voltage stabilizing circuit for stabilizing an output voltage of the boost circuit,
   the output voltage of said boost circuit stabilized by said voltage stabilizing circuit being supplied to said word lines as an activating voltage of said word lines.

2. The semiconductor memory device as set forth in claim 1, wherein
   the voltage stabilizing circuit comprises a constant voltage dropping means connected between an output node of said boost circuit and a reference voltage source.

3. The semiconductor memory device as set forth in claim 2, wherein
   the constant voltage dropping means contains at least one metal-insulator-semiconductor transistor having a gate and drain connected to the gate.

4. The semiconductor memory device as set forth in claim 1, wherein
   the output voltage of said voltage stabilizing circuit is adjusted to a minimum operating voltage of the memory cells or a voltage near to the minimum operating voltage.

5. The semiconductor memory device as set forth in claim 1, wherein
   the voltage stabilizing circuit having a means for generating a reference voltage and an operational amplifier;
   the output voltage of said boost circuit is supplied to the operational amplifier as a power supply voltage of the operational amplifier;
   one input terminal of the operational amplifier is connected to the means for generating the reference voltage, an output node of the operational amplifier is connected to the other input terminal of the operational amplifier to form a negative feedback circuit, and the output voltage of said voltage stabilizing circuit is adjusted to a minimum operating voltage of the memory cells or a voltage near to the minimum operating voltage.

6. The semiconductor memory device as set forth in claim 5, wherein
   the output terminal of said boost circuit is connected to a constant voltage dropping means.

7. A semiconductor memory device comprising:
   bit lines arranged in a column direction:
      word lines arranged in a row direction;
   memory cells arranged at the cross points of the bit lines and word lines;
   a boost circuit for boosting a power supply voltage; and
   a voltage stabilizing circuit for stabilizing an output voltage of the boost circuit, the voltage stabilizing circuit having a means for generating a reference voltage and having an operational amplifier, the output voltage of said boost circuit supplied to the operational amplifier as a power supply voltage of the operational amplifier, one input terminal of the operational amplifier connected to the means for generating the reference voltage, an output node of the operational amplifier connected to the other input terminal of the operational amplifier to form a negative feedback circuit, and the output voltage of said voltage stabilizing circuit adjusted to a minimum operating voltage of the memory cells or a voltage near to the minimum operating voltage,
   the output voltage of said boost circuit stabilized by said voltage stabilizing circuit being supplied to said word lines as an activating voltage of said word lines.

8. The semiconductor memory device as set forth in claim 7, wherein
   the voltage stabilizing circuit comprises a constant voltage dropping means connected between an output node of said boost circuit and the reference voltage source.

9. The semiconductor memory device as set forth in claim 8, wherein
   the constant voltage dropping means contains at least one metal-insulator-semiconductor transistor having a gate and drain connected to the gate.

10. The semiconductor device as set forth in claim 7, wherein
    the boost circuit is constituted by a charge pumping circuit, a repeat frequency of a charge pump of the charge pumping circuit being switched between activation and standby times, and the frequency during said standby being set lower than the frequency during said activation.

11. The semiconductor memory device as set forth in claim 7, wherein
    the output voltage of said voltage stabilizing circuit is adjusted to a minimum operating voltage of the memory cells or a voltage near to the minimum operating voltage.

12. The semiconductor memory device as set forth in claim 7, wherein
    the output terminal of said boost circuit is connected to a constant voltage dropping means.

\* \* \* \* \*